US011923219B2

(12) United States Patent
Choi et al.

(10) Patent No.: US 11,923,219 B2
(45) Date of Patent: Mar. 5, 2024

(54) APPARATUS FOR TREATING SUBSTRATE

(71) Applicant: SEMES CO., LTD., Cheonan-si (KR)

(72) Inventors: Youngseop Choi, Cheonan-si (KR); Young Hun Lee, Cheonan-si (KR); Yong-Jun Seo, Hwaseong-si (KR); Bok Kyu Lee, Cheonan-si (KR); Miso Park, Daejeon (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 582 days.

(21) Appl. No.: 16/912,762

(22) Filed: Jun. 26, 2020

(65) Prior Publication Data

US 2020/0411344 A1    Dec. 31, 2020

(30) Foreign Application Priority Data

Jun. 27, 2019  (KR) .......................... 10-2019-0076976

(51) Int. Cl.
*H01L 21/67* (2006.01)
*B08B 3/08* (2006.01)
(Continued)

(52) U.S. Cl.
CPC .......... *H01L 21/67248* (2013.01); *B08B 3/08* (2013.01); *B08B 7/04* (2013.01);
(Continued)

(58) Field of Classification Search
CPC .. B08B 13/00; B08B 7/04; B08B 3/08; H01L 21/6719; H01L 21/67103; H01L 21/67051; H01L 21/67248
See application file for complete search history.

(56) References Cited

U.S. PATENT DOCUMENTS 5,650,082 A * 7/1997 Anderson ............. C23C 16/481
                                            219/390
6,895,831 B2 * 5/2005 Hunter ............. H01L 21/67167
                                            414/148
(Continued)

FOREIGN PATENT DOCUMENTS

KR        100780383 B1    11/2007
KR    10-2017-0006570 A    1/2017
(Continued)

OTHER PUBLICATIONS

Machine Translation of Korean Office Action for Korean Application 10-2019-0076976, Sep. 2020. (Year: 2020).*
(Continued)

*Primary Examiner* — Benjamin L Osterhout
(74) *Attorney, Agent, or Firm* — Harness, Dickey & Pierce, P.L.C.

(57) ABSTRACT

The inventive concept relates to an apparatus for treating a substrate. In an embodiment, the apparatus includes a process chamber having a process space in which the substrate is treated with a fluid in a supercritical state, a support unit that supports the substrate in the process space, a fluid supply unit that supplies the fluid into the process space, a filler member disposed to face the substrate placed on the support unit in the process space, and a measurement unit that measures a state in the process space, the measurement unit being provided in the filler member.

19 Claims, 8 Drawing Sheets

(51) Int. Cl.
*B08B 7/04* (2006.01)
*B08B 13/00* (2006.01)

(52) U.S. Cl.
CPC ........ *B08B 13/00* (2013.01); *H01L 21/67051* (2013.01); *H01L 21/67103* (2013.01); *H01L 21/6719* (2013.01)

(56) References Cited

U.S. PATENT DOCUMENTS

2012/0183915 A1* 7/2012 Merry ................. C23C 16/52
                                                              432/49
2017/0008040 A1* 1/2017 Jeong ................ H01L 21/02101
2018/0308724 A1* 10/2018 Chou ................ H01L 21/67115
2019/0103296 A1* 4/2019 Ji ............................ G01J 5/027

FOREIGN PATENT DOCUMENTS

| KR | 10-2018-0039458 A | 4/2018 |
| KR | 10-2018-0077949 A | 7/2018 |
| KR | 10-2018-0079548 A | 7/2018 |
| KR | 10-2019-0001754 A | 1/2019 |
| WO | WO-2017/131306 A1 | 8/2017 |

OTHER PUBLICATIONS

Office Action for Korean Application No. 10-2019-0076976 dated Sep. 7, 2020.

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2019-0076976 filed on Jun. 27, 2019, in the Korean Intellectual Property Office, the entire contents of which are hereby incorporated by reference.

BACKGROUND

Embodiments of the inventive concept described herein relate to an apparatus for treating a substrate.

In general, semiconductor elements are manufactured from a substrate such as a wafer. Specifically, the semiconductor elements are manufactured by forming a fine circuit pattern on an upper surface of the substrate through a deposition process, a photolithography process, an etching process, and the like.

While the processes are performed, various foreign substances may be generated on the upper surface of the substrate on which the circuit pattern is formed. To remove the foreign substances, a cleaning process may be performed.

Recently, a supercritical fluid is used in a process of cleaning a substrate. For example, the cleaning process may be performed in a manner of cleaning an upper surface of the substrate using isopropyl alcohol (hereinafter, referred to as the "IPA") and removing the IPA remaining on the substrate by dispensing carbon dioxide ($CO_2$) in a supercritical state onto the upper surface of the substrate.

When a supercritical fluid is used in a cleaning apparatus, a state in the cleaning apparatus cannot be recognized until a process is completed, and therefore it is difficult to control conditions such as an amount of supercritical fluid to be supplied, an amount of supercritical fluid to be released, process time, and the like. In a supercritical process, the temperature and the density of a supercritical fluid may be changed depending on an internal pressure change, and a pattern leaning phenomenon or the behavior of particles may be varied depending on a temperature distribution of the supercritical fluid. Furthermore, process performance is highly dependent on a temperature distribution of the supercritical fluid. Therefore, a method for measuring the temperature distribution is required.

SUMMARY

Embodiments of the inventive concept provide a substrate treating apparatus and method for improving cleaning efficiency in cleaning a substrate using a supercritical fluid.

Embodiments of the inventive concept provide a substrate treating apparatus and method for monitoring a state in a chamber when cleaning a substrate using a supercritical fluid.

Embodiments of the inventive concept provide a substrate treating apparatus and method for detecting an optimal process condition when cleaning a substrate using a supercritical fluid.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a process chamber having a process space in which the substrate is treated with a fluid in a supercritical state, a support unit that supports the substrate in the process space, a fluid supply unit that supplies the fluid into the process space, a filler member disposed to face the substrate placed on the support unit in the process space, and a measurement unit that measures a state in the process space, the measurement unit being provided in the filler member.

In an embodiment, the measurement unit may include temperature sensors.

In an embodiment, the measurement unit may include a board on which the temperature sensors are provided in an array.

In an embodiment, the temperature sensors may be provided in one or more arrays and may be provided on a surface facing the substrate.

In an embodiment, a housing of the filler member may be formed of a first material.

In an embodiment, the measurement unit may further include a communication module, the filler member may include a housing formed of a first material and a transmissive window formed of a second material and installed in the housing, the transmissive window being capable of transfer of a wireless communication signal, and the first material may have a higher heat transfer rate than the second material.

In an embodiment, a hole may be formed in the housing, and the transmissive window may be provided in the hole.

In an embodiment, the first material may be a metallic material, and the second material may be a resin material.

In an embodiment, the second material may be at least one of PEEK, polyamide, or PTFE.

In an embodiment, the filler member may include a housing including an upper member and a lower member, a transmissive window may be between the upper member and the lower member to define an interior space such that the upper member and the lower member define a top and a bottom of the interior space, and the transmissive window defines a respective side of the interior space, and each of the upper member and the lower member may include a material having a higher heat transfer rate than the second material of the transmissive window.

In an embodiment, each of the upper member and the lower member may include a metallic material.

In an embodiment, the first material and the second material may be the same material.

In an embodiment, the third material may be at least one of PEEK, polyamide, or PTFE.

In an embodiment, the third material may be a resin material.

In an embodiment, the measurement unit may include one or more sensors, a battery that supplies power to the sensors, and a communication module that transmits signals measured by the sensors to the outside.

In an embodiment, the communication module may be provided adjacent to the transmissive window.

In an embodiment, the process chamber may include an upper body in which the support unit is installed, a lower body in which the filler member is installed and that provides the process space together with the upper body, an actuator that moves one of the upper body and the lower body relative to the other, an upper supply line that supplies the fluid into the process space and that is provided in the upper body, and a lower supply line that supplies the fluid into the process space and that is provided in the lower body.

The substrate may be supported such that a patterned surface faces upward, and the filler member may be located between the lower supply line and the substrate.

In an embodiment, the support unit may be provided to support an edge region of a bottom surface of the substrate, and the filler member may be located below the support unit in the process space.

In an embodiment, the measurement unit may include one or more sensors and a memory that stores information values measured by the one or more sensors.

In an embodiment, the measurement unit may further include a battery that supplies power to the one or more sensors.

In an embodiment, the apparatus may further include a connector exposed outside the housing and connected with the memory, the connector being capable of transmission of data in the memory to the outside.

In an embodiment, the measurement unit may further include a leveling sensor that measures posture of the apparatus.

In an embodiment, the measurement unit may further include a pressure sensor.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
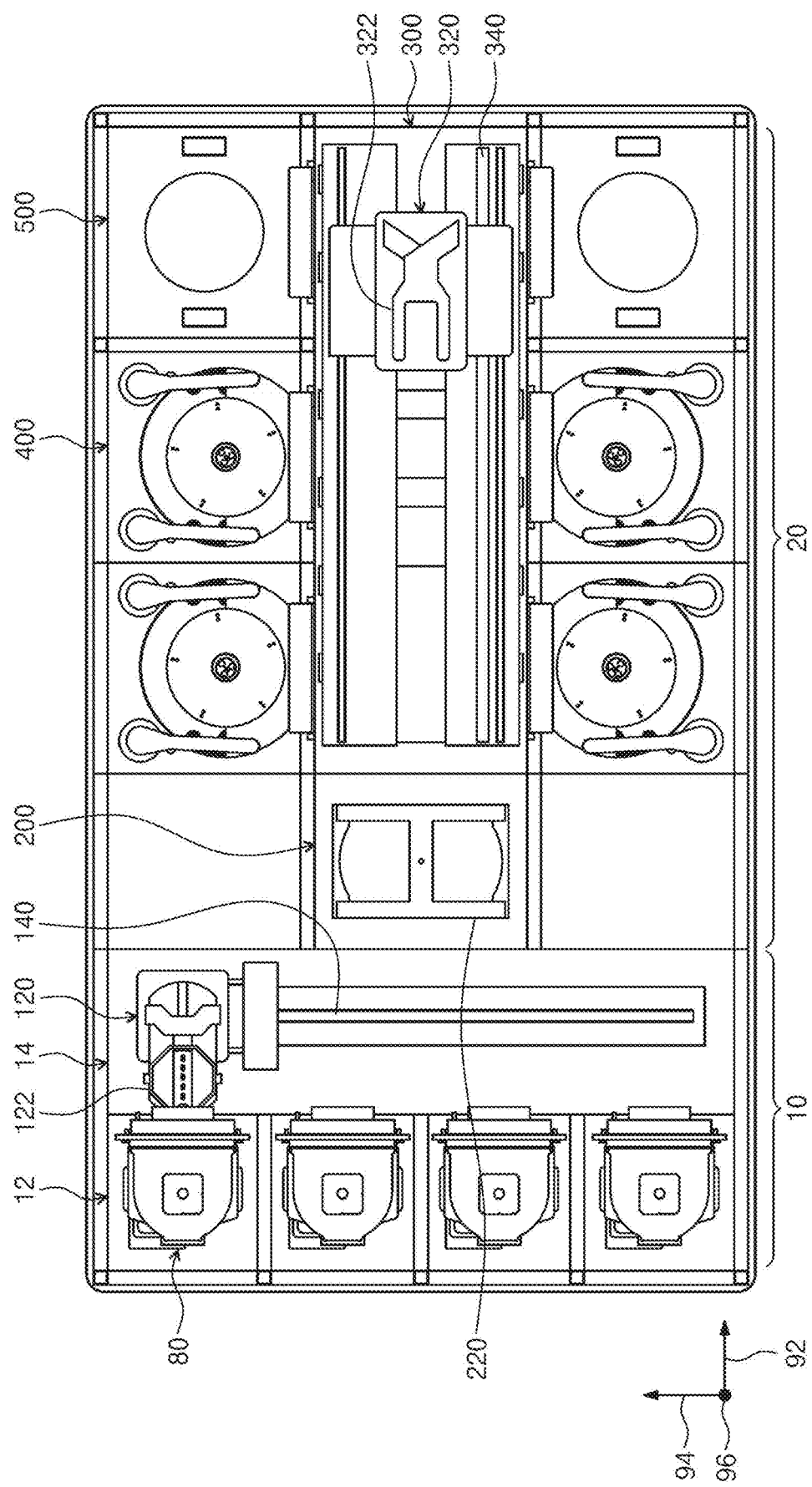
FIG. 1 is a schematic plan view illustrating a substrate treating system according to an embodiment of the inventive concept.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the dimensions of components are exaggerated for clarity of illustration.

FIG. 1 is a schematic plan view illustrating a substrate treating system according to an embodiment of the inventive concept.

Referring to FIG. 1, the substrate treating system includes an index module 10, a process module 20, and a controller (not illustrated). According to an embodiment, the index module 10 and the process module 20 are disposed along one direction. Hereinafter, the direction in which the index module 10 and the process module 20 are disposed is referred to as a first direction 92, a direction perpendicular to the first direction 92 when viewed from above is referred to as a second direction 94, and a direction perpendicular to both the first direction 92 and the second direction 94 is referred to as a third direction 96.

The index module 10 transfers substrates W from carriers 80 having the substrates W received therein to the process module 20 and places, in the carriers 80, the substrates W completely treated in the process module 20. The lengthwise direction of the index module is parallel to the second direction 94. The index module 10 has a plurality of load ports 12 and an index frame 14. The load ports 12 are located on the opposite side to the process module 20 with respect to the index frame 14. The carriers 80 having the substrates W received therein are placed on the load ports 12. The plurality of load ports 12 may be disposed along the second direction 94.

Airtight carriers, such as front open unified pods (FOUPs), may be used as the carriers 80. The carriers 80 may be placed on the load ports 12 by a transfer unit (not illustrated) such as an overhead transfer, an overhead conveyor, or an automatic guided vehicle, or by an operator.

An index robot 120 is provided in the index frame 14. A guide rail 140, the lengthwise direction of which is parallel to the second direction 94, is provided in the index frame 14 and the index robot 120 is movable on the guide rail 140. The index robot 120 includes a hand 122 on which the substrate W is placed, and the hand 122 is movable forward and backward, rotatable about an axis facing in the third direction 96, and movable along the third direction 96. A plurality of hands 122 may be provided to be spaced apart from each other in the vertical direction. The hands 122 may independently move forward and backward.

The process module 20 includes a buffer unit 200, a transfer apparatus 300, liquid treatment apparatuses 400, and cleaning apparatuses 500. The buffer unit 200 provides a space in which the substrates W loaded into the process module 20 and the substrates W to be unloaded from the process module 20 temporarily stay. Each of the liquid treatment apparatuses 400 performs a liquid treatment process of treating the substrate W by dispensing liquids onto the substrate W. Each of the cleaning apparatuses 500 performs a drying process of removing a liquid remaining on the substrate W. The transfer apparatus 300 transfers the substrates W between the buffer unit 200, the liquid treatment apparatuses 400, and the cleaning apparatuses 500.

The transfer apparatus 300 may be disposed such that the lengthwise direction thereof is parallel to the first direction 92. The buffer unit 200 may be disposed between the index module 10 and the transfer apparatus 300. The liquid treatment apparatuses 400 and the cleaning apparatuses 500 may be disposed on opposite sides of the transfer apparatus 300. The liquid treatment apparatuses 400 and the transfer apparatus 300 may be disposed along the second direction 94. The cleaning apparatuses 500 and the transfer apparatus 300 may be disposed along the second direction 94. The buffer unit 200 may be located at one end of the transfer apparatus 300.

According to an embodiment, the liquid treatment apparatuses 400 may be disposed on the opposite sides of the transfer apparatus 300. The cleaning apparatuses 500 may be disposed on the opposite sides of the transfer apparatus 300. The liquid treatment apparatuses 400 may be disposed closer to the buffer unit 200 than the cleaning apparatuses 500. On one side of the transfer apparatus 300, the liquid treatment apparatuses 400 may be provided in an A×B array (A and B being natural numbers of 1 or larger) along the first direction 92 and the third direction 96. Furthermore, on the one side of the transfer apparatus 300, the cleaning apparatuses 500 may be provided in a C×D array (C and D being natural numbers of 1 or larger) along the first direction 92 and the third direction 96. Alternatively, only the liquid treatment apparatuses 400 may be provided on the one side of the transfer apparatus 300, and only the cleaning apparatuses 500 may be provided on the opposite side of the transfer apparatus 300.

The transfer apparatus 300 has a transfer robot 320. A guide rail 340, the lengthwise direction of which is parallel to the first direction 92, may be provided in the transfer apparatus 300, and the transfer robot 320 is movable on the guide rail 340. The transfer robot 320 includes a hand 322 on which the substrate W is placed. The hand 322 is movable forward and backward, rotatable about an axis facing in the third direction 96, and movable along the third direction 96. A plurality of hands 322 may be provided to be spaced apart from each other in the vertical direction and may independently move forward and backward.

The buffer unit 200 includes a plurality of buffers 220 in which the substrates W are placed. The buffers 220 may be disposed to be spaced apart from each other along the third direction 96. A front face and a rear face of the buffer unit 200 are open. The front face is opposite the index module 10, and the rear face is opposite the transfer apparatus 300. The index robot 120 may approach the buffer unit 200 through the front face, and the transfer robot 320 may approach the buffer unit 200 through the rear face.

Figure 2:
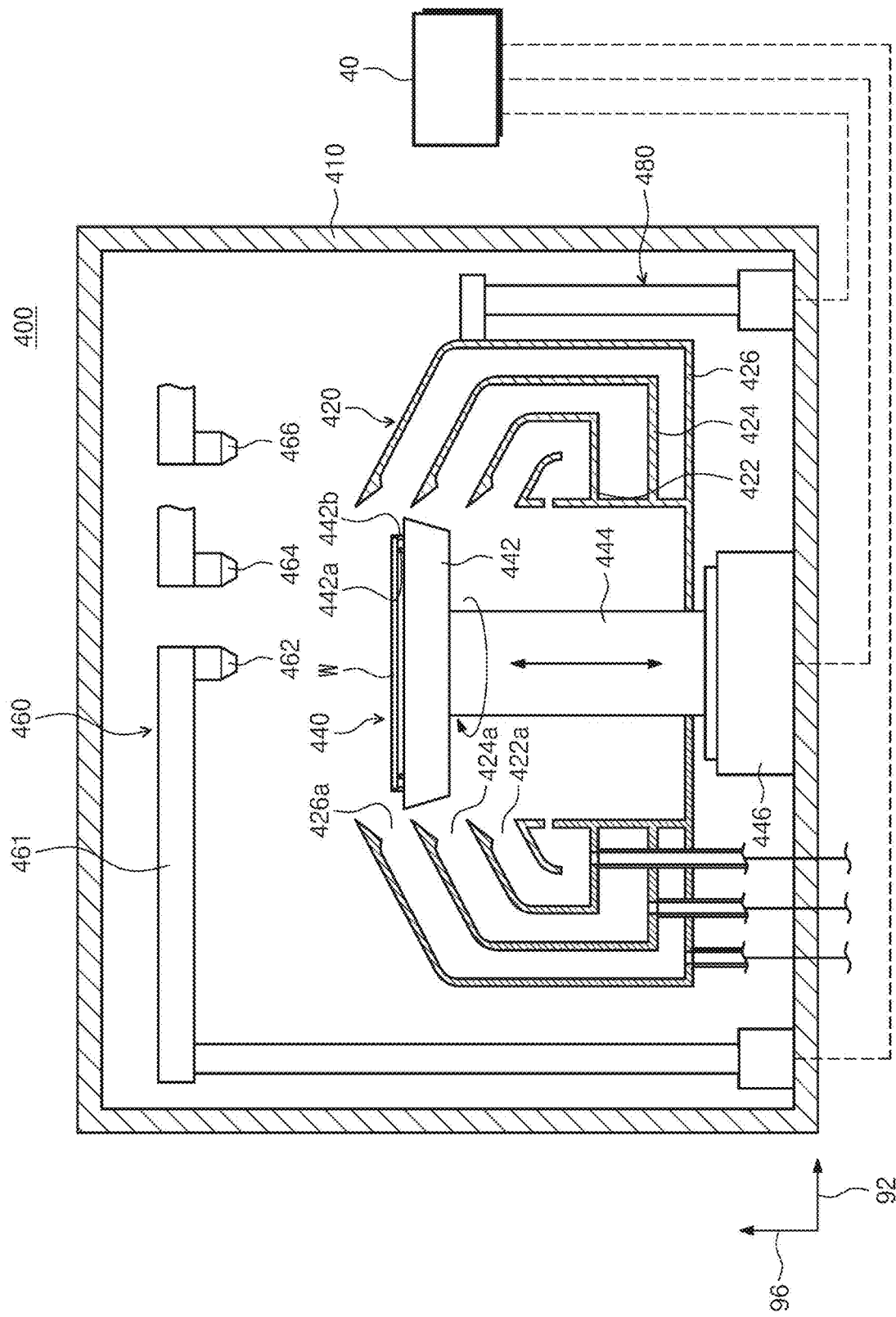
FIG. 2 is a schematic view illustrating one embodiment of liquid treatment apparatuses of FIG. 1.

FIG. 2 is a schematic view illustrating one embodiment of the liquid treatment apparatuses 400 of FIG. 1. Referring to FIG. 2, the liquid treatment apparatus 400 has a housing 410, a cup 420, a support unit 440, a liquid dispensing unit 460, and a lifting unit 480. The housing 410 has a substantially rectangular parallelepiped shape. The cup 420, the support unit 440, and the liquid dispensing unit 460 are disposed in the housing 410.

The cup 420 has a process space that is open at the top, and a substrate W is treated with liquids in the process space. The support unit 440 supports the substrate W in the process space. The liquid dispensing unit 460 dispenses the liquids onto the substrate W supported on the support unit 440. A plurality of types of liquids may be sequentially dispensed onto the substrate W. The lifting unit 480 adjusts the height of the cup 420 relative to the support unit 440.

According to an embodiment, the cup 420 has a plurality of recovery bowls 422, 424, and 426. The recovery bowls 422, 424, and 426 have recovery spaces for recovering the liquids used to treat the substrate W. The recovery bowls 422, 424, and 426 are provided in a ring shape that surrounds the support unit 440. The treatment liquids scattered by rotation of the substrate W during liquid treatment processes may be introduced into the recovery spaces through inlets 422a, 424a, and 426a of the respective recovery bowls 422, 424, and 426. According to an embodiment, the cup 420 has the first recovery bowl 422, the second recovery bowl 424, and the third recovery bowl 426. The first recovery bowl 422 is disposed to surround the support unit 440, the second recovery bowl 424 is disposed to surround the first recovery bowl 422, and the third recovery bowl 426 is disposed to surround the second recovery bowl 424. The second inlet 424a through which a liquid is introduced into the second recovery bowl 424 may be located in a higher position than the first inlet 422a through which a liquid is introduced into the first recovery bowl 422, and the third inlet 426a through which a liquid is introduced into the third recovery bowl 426 may be located in a higher position than the second inlet 424a.

The support unit 440 has a support plate 442 and a drive shaft 444. An upper surface of the support plate 442 may have a substantially circular shape and may have a larger diameter than the substrate W. Support pins 442a are provided on a central portion of the support plate 442 to support the backside of the substrate W. The support pins 442a protrude upward from the support plate 442 to cause the substrate W to be spaced apart from the support plate 442 by a predetermined distance. Chuck pins 442b are provided on an edge portion of the support plate 442. The chuck pins 442b protrude upward from the support plate 442 and support a lateral portion of the substrate W to prevent the substrate W from escaping from the support unit 440 when being rotated. The drive shaft 444 is driven by an actuator 446. The drive shaft 444 is connected to the center of a bottom surface of the support plate 442 and rotates the support plate 442 about the central axis thereof.

According to an embodiment, the liquid dispensing unit 460 has a first nozzle 462, a second nozzle 464, and a third nozzle 466. The first nozzle 462 dispenses a first liquid onto the substrate W. The first liquid may be a liquid for removing a film or foreign matter remaining on the substrate W. The second nozzle 464 dispenses a second liquid onto the substrate W. The second liquid may be a liquid that dissolves well in a third liquid. For example, the second liquid may be a liquid that dissolves better in the third liquid than the first liquid. The second liquid may be a liquid for neutralizing the first liquid dispensed onto the substrate W. Furthermore, the second liquid may be a liquid that neutralizes the first liquid and that dissolves better in the third liquid than the first liquid. According to an embodiment, the second liquid may be water. The third nozzle 466 dispenses the third liquid onto the substrate W. The third liquid may be a liquid that dissolves well in a supercritical fluid that is used in the cleaning apparatuses 500. For example, the third liquid may be a liquid that dissolves better in the supercritical fluid used in the cleaning apparatuses 500 than the second liquid. According to an embodiment, the third liquid may be an organic solvent. The organic solvent may be isopropyl alcohol (IPA). According to an embodiment, the supercritical fluid may be carbon dioxide. The first nozzle 462, the second nozzle 464, and the third nozzle 466 may be supported on different arms 461. The arms 461 may be independently moved. Selectively, the first nozzle 462, the second nozzle 464, and the third nozzle 466 may be mounted on the same arm and may be simultaneously moved.

The lifting unit 480 moves the cup 420 in the vertical direction. The relative height between the cup 420 and the substrate W is changed by the vertical movement of the cup 420. Accordingly, the recovery bowls 422, 424, and 426 for recovering the treatment liquids may be changed depending on the types of liquids dispensed onto the substrate W, and the liquids may be separately recovered. Unlike the above description, the cup 420 may be fixedly installed, and the lifting unit 480 may move the support unit 440 in the vertical direction.

Figure 3:
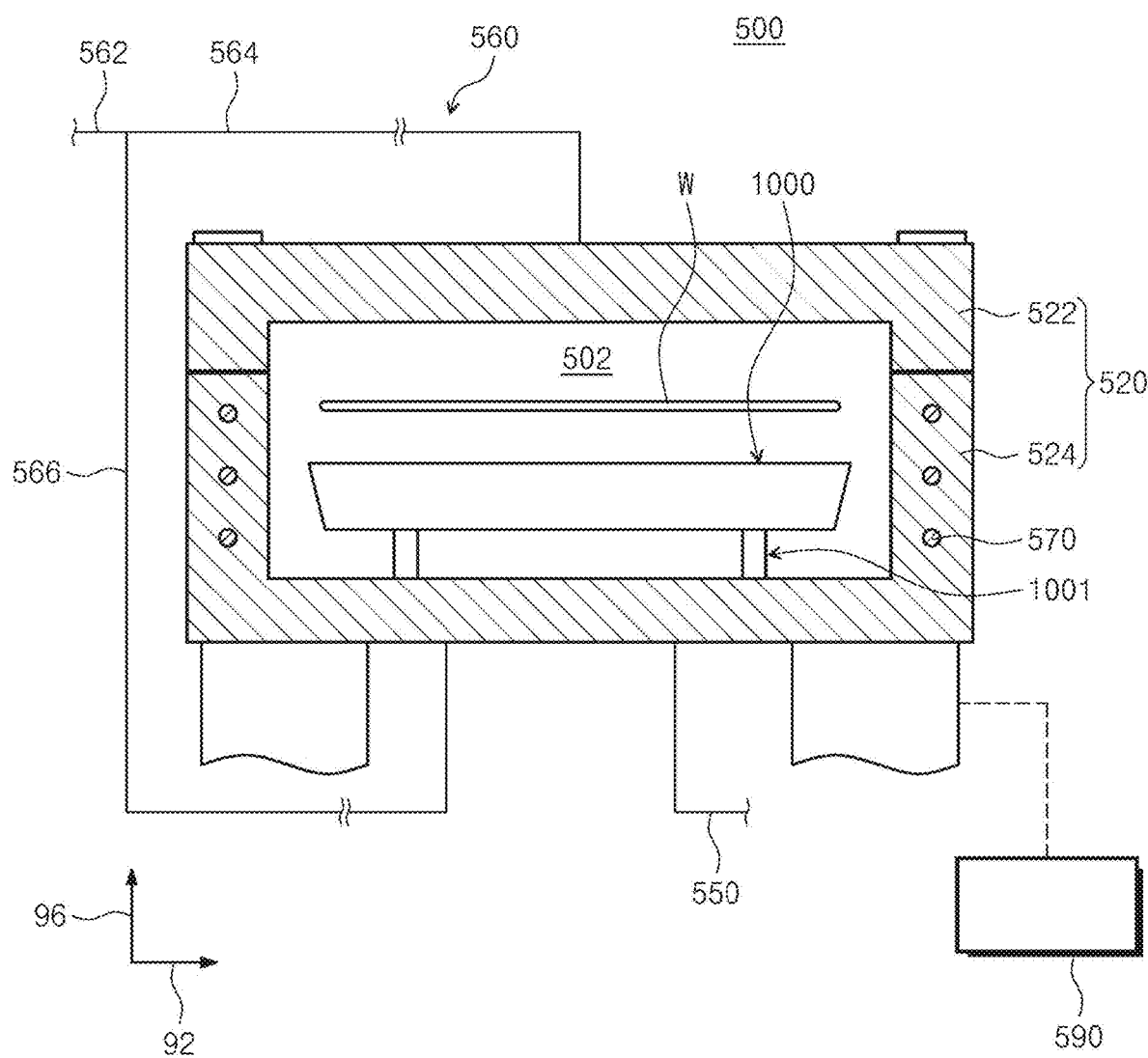
FIG. 3 is a schematic view illustrating one embodiment of cleaning apparatuses of FIG. 1.

FIG. 3 is a schematic view illustrating one embodiment of the cleaning apparatuses 500 of FIG. 1. According to an embodiment, the cleaning apparatus 500 removes a liquid on a substrate W using a supercritical fluid. The cleaning apparatus 500 has a body 520, a support (not illustrated), a fluid supply unit 560, and a filler unit 1000.

The body 520 provides a process space 502 in which a cleaning process is performed. The body 520 has an upper body 522 and a lower body 524. The upper body 522 and the lower body 524 are combined with each other to provide the above-described process space 502. The upper body 522 is provided over the lower body 524. The upper body 522 may be fixed in position, and the lower body 524 may be raised or lowered by a drive member 590 such as a cylinder. When the lower body 524 is separated from the upper body 522, the process space 502 is opened. At this time, the substrate W is carried into or out of the process space 502. During the process, the lower body 524 is brought into close contact with the upper body 522 to seal the process space 502 from the outside. The cleaning apparatus 500 has a heater 570. According to an embodiment, the heater 570 is located in a wall of the body 520. The heater 570 heats the process space 502 of the body 520 such that a fluid supplied into the interior space of the body 520 is maintained in a supercritical state. An atmosphere by the supercritical fluid is formed in the process space 502.

The support (not illustrated) supports the substrate W in the process space 502 of the body 520. The support (not illustrated) has fixed rods (not illustrated) and mounting parts (not illustrated). The fixed rods (not illustrated) are fixedly installed on the upper body 522 to protrude downward from a bottom surface of the upper body 522. The lengthwise direction of the fixed rods (not illustrated) is oriented in the vertical direction. The fixed rods (not illustrated) are located to be spaced apart from each other. The fixed rods (not illustrated) are disposed such that the substrate W does not interfere with the fixed rods (not illustrated) when the substrate W is placed in or extracted from a space surrounded by the fixed rods (not illustrated). The mounting parts (not illustrated) are coupled to the respective fixed rods (not illustrated). The mounting parts (not illustrated) extend from lower ends of the fixed rods (not illustrated) toward the space surrounded by the fixed rods (not illustrated). Due to the above-described structure, an edge region of the substrate W placed in the process space 502 of the body 520 is placed on the mounting parts (not illustrated), and the entire top side of the substrate W, a central region of the backside of the substrate W, and part of the edge region of the backside of the substrate W are exposed to a cleaning fluid supplied into the process space 502. In an embodiment, the substrate W is supported such that a patterned surface faces upward.

The fluid supply unit 560 supplies the cleaning fluid into the process space 502 of the body 520. According to an embodiment, the cleaning fluid may be supplied in a supercritical state into the process space 502. Alternatively, the cleaning fluid may be supplied in a gaseous state into the process space 502 and may experience a phase change into a supercritical state in the process space 502. According to an embodiment, the fluid supply unit 560 has a main supply line 562, an upper supply line 564, and a lower supply line 566. The upper supply line 564 and the lower supply line 566 branch off from the main supply line 562. The upper supply line 564 is coupled to the upper body 522 and supplies the cleaning fluid from above the substrate W placed on the support (not illustrated). According to an embodiment, the upper supply line 564 is coupled to the center of the upper body 522. The lower supply line 566 is coupled to the lower body 524 and supplies the cleaning fluid from below the substrate W placed on the support (not illustrated). According to an embodiment, the lower supply line 566 may be coupled to the center of the lower body 524. An exhaust unit 550 is coupled to the lower body 524. When the lower supply line 566 is coupled to the center of the lower body 524, an exhaust port (not illustrated) of the exhaust unit 550 may be eccentrically located off the center of the lower body 524. The supercritical fluid in the process space 502 of the body 520 is released outside the body 520 through the exhaust unit 550.

The filler unit 1000 may be disposed in the process space 502 of the body 520. The filler unit 1000 may be provided in a cylindrical or conical shape having a set volume. The filler unit 1000 is supported by support rods 1001 so as to be spaced apart upward from a bottom surface of the body 520. The support rods 1001 may be provided in a rod shape. The support rods 1001 may be disposed to be spaced apart from each other at predetermined intervals. When viewed from above, the filler unit 1000 may be provided to cover a supply port (not illustrated) of the lower supply line 566 and the exhaust port (not illustrated) of the exhaust unit 550. The filler unit 1000 may prevent the cleaning fluid supplied through the lower supply line 566 from being directly dispensed toward the substrate W to damage the substrate W.

Figure 4:
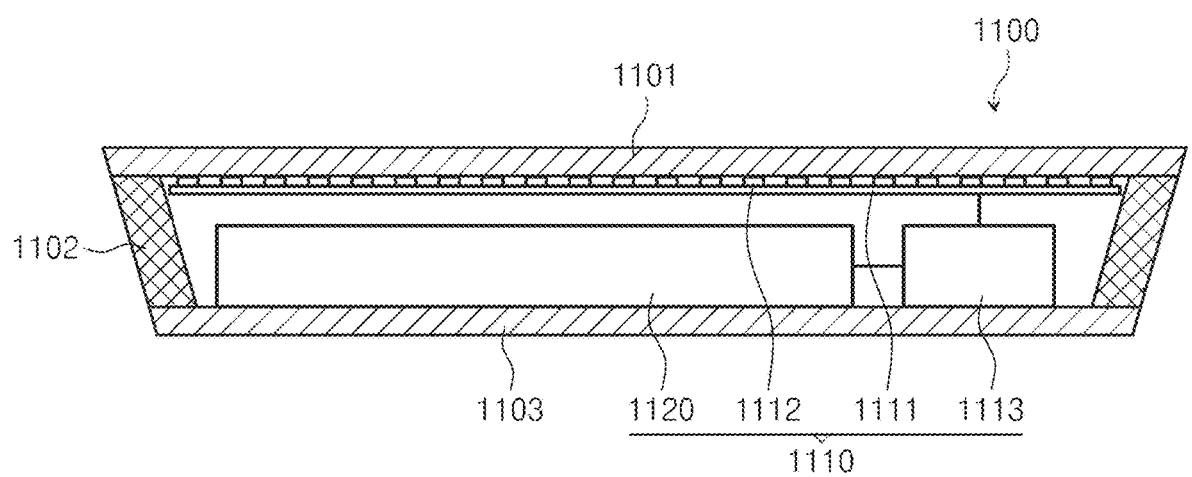
FIG. 4 is a view illustrating a section according to a first embodiment of a filler unit of a cleaning apparatus of FIG. 3.
Figure 5:
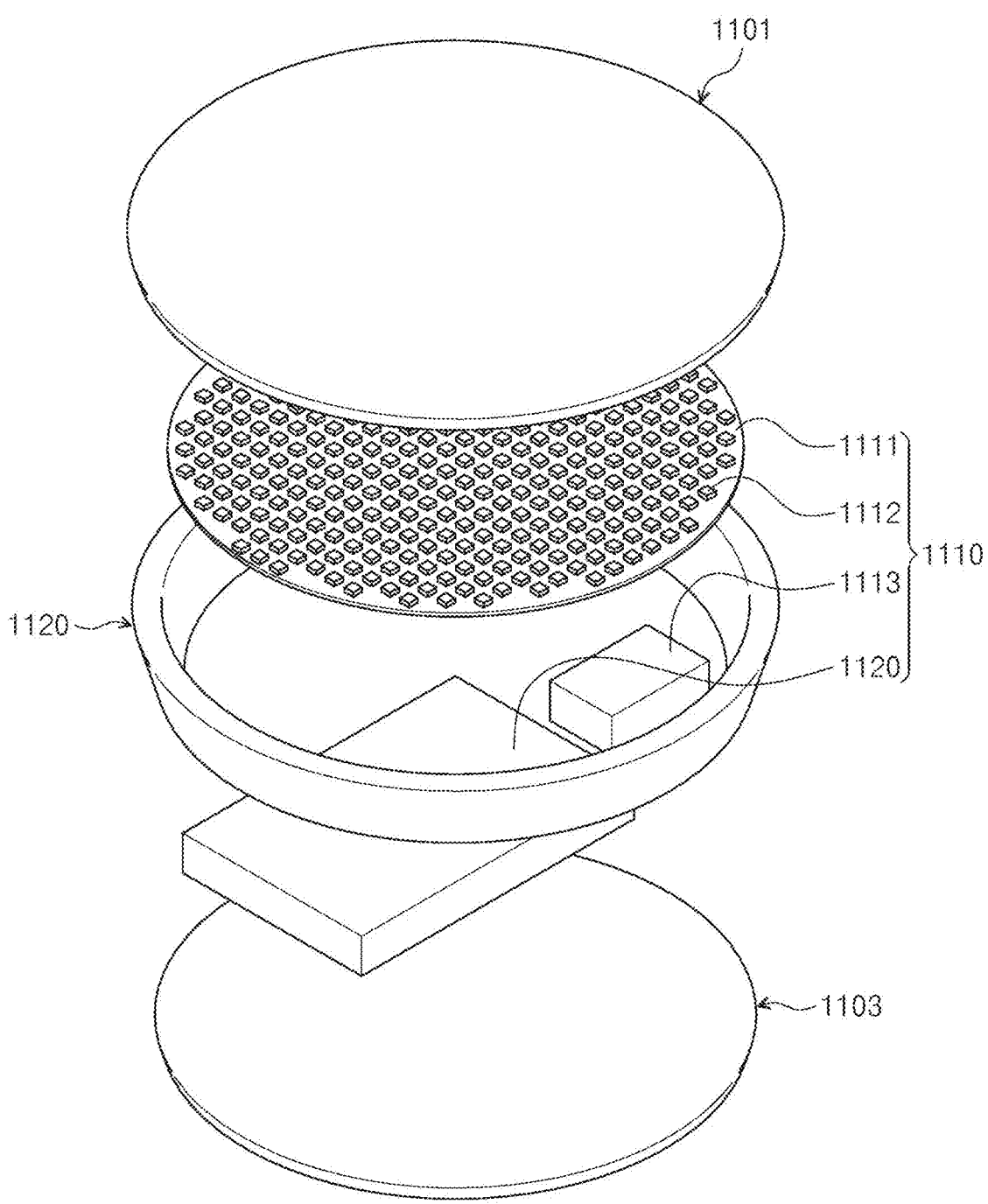
FIG. 5 illustrates an exploded perspective view according to the first embodiment of the filler unit of the cleaning apparatus of FIG. 3.

FIG. 4 is a view illustrating a section according to a first embodiment of the filler unit of the cleaning apparatus of FIG. 3, and FIG. 5 illustrates an exploded perspective view according to the first embodiment of the filler unit of the cleaning apparatus of FIG. 3. Referring to FIGS. 4 and 5, a filler member 1100 includes a housing and a measurement unit 1110, and the housing includes an upper member 1101, a transmissive window 1102, and a lower member 1103.

The upper member 1101 forms an upper surface of the housing. The upper member 1101 is formed of a metallic material. The metallic material preferably has a high thermal conductivity. Furthermore, the metallic material is a material that resists a supercritical fluid in a high-temperature and high-pressure state. The metallic material is preferably stainless steel.

The transmissive window 1102 forms a sidewall of the housing. The transmissive window 1102 is formed of a resin material. The resin material is preferably a material through which a wireless communication signal passes. The resin material may be at least one of PEEK, polyamide, or PTFE.

The lower member 1103 forms a lower surface of the housing. The lower member 1103 is formed of a metallic material. The metallic material is a material that resists a supercritical fluid in a high-temperature and high-pressure state. The metallic material is preferably stainless steel.

The upper member 1101 is preferably formed of a material having a higher heat transfer rate than the transmissive window 1102.

The measurement unit 1110 includes a board 1111, a temperature sensor array including temperature sensors 1112, a module device 1113, and a battery 1120.

The board 1111 may be a circuit board. The temperature sensor array is adjacent to the upper member 1101, and the temperature sensors 1112 are arranged in an array on the circuit board 1111. The temperature sensors 1112 adjacent to the upper member 1101 indirectly measure an effect of temperature transferred to the substrate W in the body 520.

The temperature sensor array may be provided such that the temperature sensors 1112 are coupled to the upper member 1101 without the board 1111.

Figure 6:
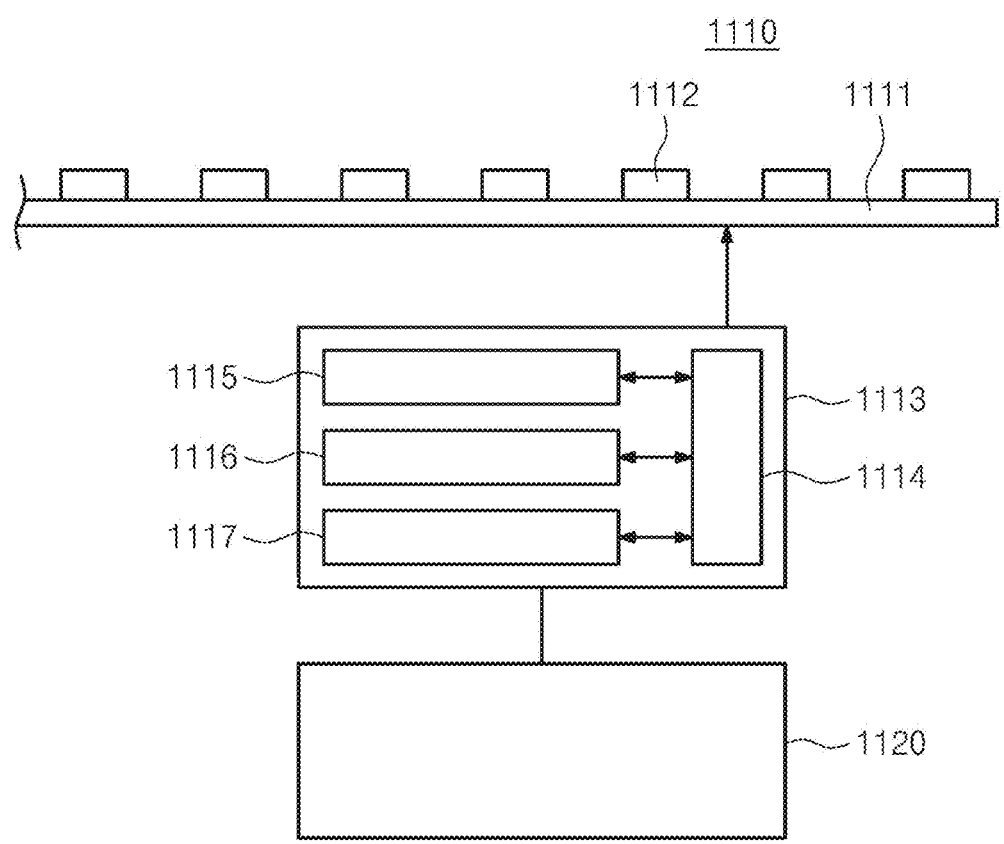
FIG. 6 is a schematic view illustrating a measurement unit 1110.

FIG. 6 is a schematic view illustrating the measurement unit 1110.

The measurement unit 1110 includes the temperature sensor array, the module device 1113, and the battery 1120. The components of the measurement unit 1110 may be connected with one another. The module device 1113 may include a processor module 1114, a leveling sensor 1115, a pressure sensor 1116, and a communication module 1117.

The processor module 1114 may control the temperature sensor array, the communication module 1117, the leveling sensor 1115, and the pressure sensor 1116. The processor module 1114 may be included in the board 1111 of the temperature sensor array.

The temperature sensor array, which is disposed adjacent to the upper member 1101, indirectly measures the temperature around the substrate W in the process space 502 from the temperature transferred through the upper member 1101. The upper member 1101 preferably has a high heat transfer rate.

The leveling sensor 1115 may measure the posture of the cleaning apparatus 500. For example, when the cleaning apparatus 500 is greatly shaken, the posture of the cleaning apparatus 500 may be measured by the leveling sensor 1115.

The pressure sensor 1116 may indirectly measure the pressure in the body 520 by measuring a pressure change in the filler unit 1100.

The communication module 1117 may transfer, to an external device, temperature information, posture information of the apparatus, internal pressure information that are sensed by the temperature sensor array, the leveling sensor 1115, and the pressure sensor 1116. The communication module 1117 may transfer the information in real time, or may transfer stored information. In the case where the communication module 1117 transfers the stored information, the measurement unit 1110 may further include a memory (not illustrated).

The battery 1120 may supply power to the module device 1113 or the temperature sensor array.

Figure 7:
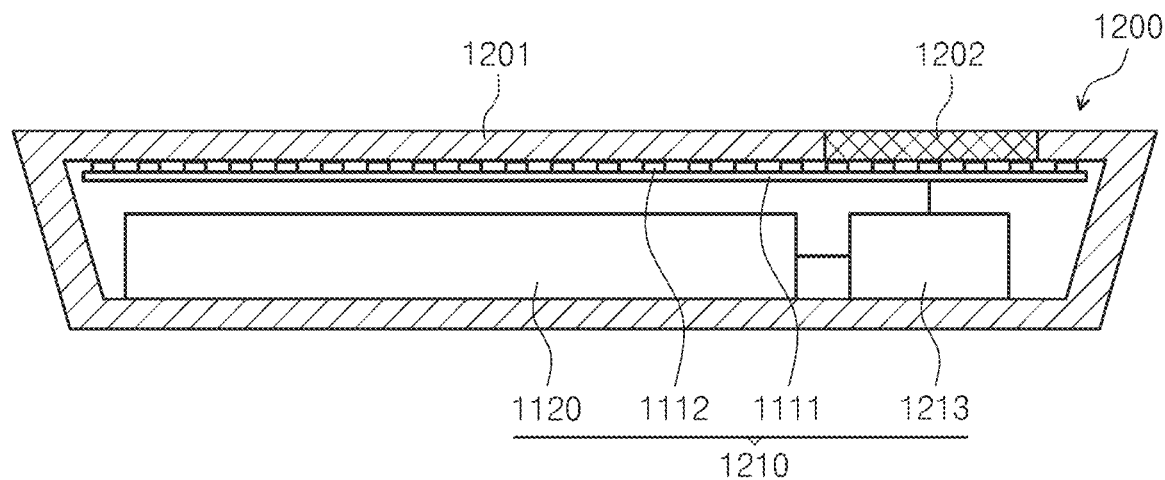
FIG. 7 is a view illustrating a section according to a second embodiment of the filler unit of the cleaning apparatus of FIG. 3.

FIG. 7 is a view illustrating a section according to a second embodiment of the filler unit of the cleaning apparatus of FIG. 3. Descriptions of components denoted by the same reference numerals as those in FIGS. 4 to 6 will be substituted by the descriptions of FIGS. 4 to 6.

In an embodiment, a housing 1201 of a filler unit 1200 may be provided in an inverted frusto-conical shape. Although not illustrated, the housing 1201 may be provided in a cylindrical shape. Although not illustrated, the housing 1201 may have a different flat surface depending on the shape of the substrate W.

The housing 1201 is formed of a metallic material. The metallic material preferably has a high thermal conductivity. Furthermore, the metallic material is a material that resists a supercritical fluid in a high-temperature and high-pressure state. The metallic material is preferably stainless steel.

Part of the housing 1201 is implemented with a transmissive window 1202. The transmissive window 1202 is formed of a resin material. The resin material is preferably a material through which a wireless communication signal passes. The resin material may be at least one of PEEK, polyamide, or PTFE. In an embodiment, a hole may be formed in part of an upper surface of the housing 1201, and the transmissive window 1202 may be provided in the hole.

For convenience of description, the transmissive window 1202 is illustrated to be excessively large. However, no special limitation applies to the size of the transmissive window 1202 as long as a wireless communication signal is able to pass through the transmissive window 1202.

The measurement unit 1210 includes a board 1111, a temperature sensor array including temperature sensors 1112, a module device 1213, and a battery 1120.

Figure 8:
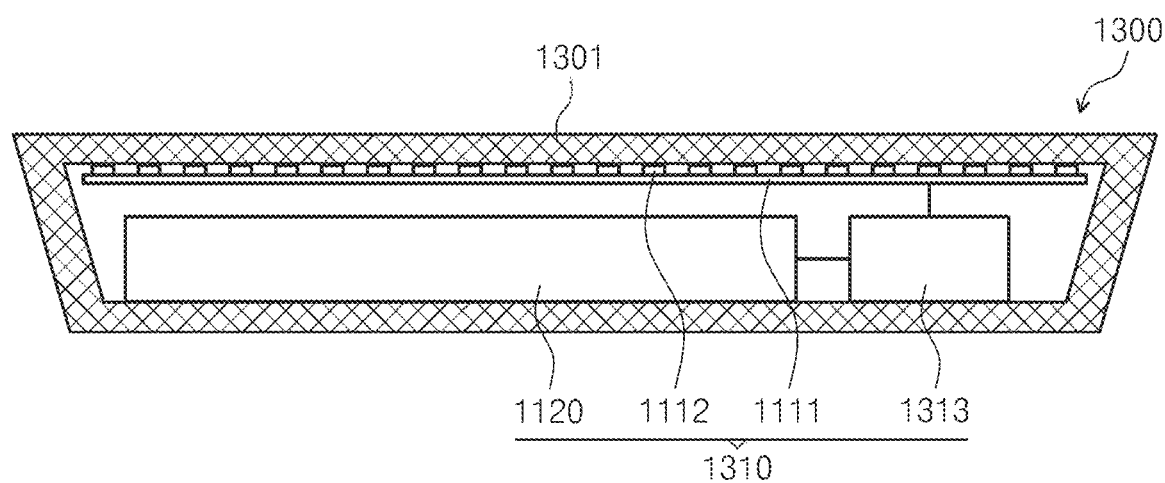
FIG. 8 is a view illustrating a section according to a third embodiment of the filler unit of the cleaning apparatus of FIG. 3.

FIG. 8 is a view illustrating a section according to a third embodiment of the filler unit of the cleaning apparatus of FIG. 3. Descriptions of components denoted by the same reference numerals as those in FIGS. 4 to 6 will be substituted by the descriptions of FIGS. 4 to 6.

A housing 1301 of a filler unit 1300 may be provided in an inverted frusto-conical shape. Although not illustrated, the housing 1301 may be provided in a cylindrical shape. Although not illustrated, the housing 1301 may have a different flat surface depending on the shape of the substrate W.

The housing 1301 is formed of a resin material. The resin material is preferably a material through which a wireless communication signal passes. The resin material may be at least one of PEEK, polyamide, or PTFE. In an embodiment, the housing 1301 is preferably formed of a material through which a wireless communication signal passes and that has a heat transfer rate similar or corresponding to that of a metallic material.

The measurement unit 1310 includes a board 1111, a temperature sensor array including temperature sensors 1112, a module device 1313, and a battery 1120.

Figure 9:
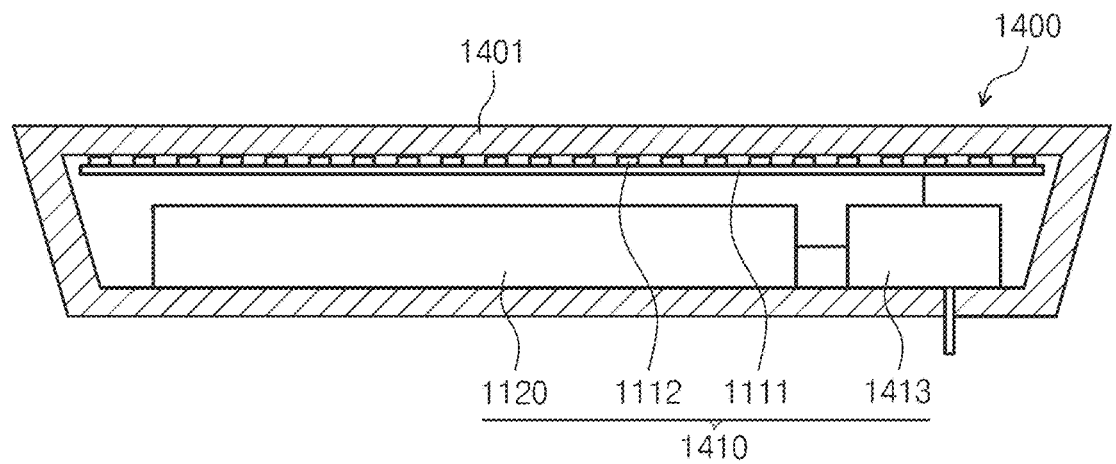
FIG. 9 is a view illustrating a section according to a fourth embodiment of the filler unit of the cleaning apparatus of FIG. 3.

FIG. 9 is a view illustrating a section according to a fourth embodiment of the filler unit of the cleaning apparatus of FIG. 3. Descriptions of components denoted by the same reference numerals as those in FIGS. 4 to 6 will be substituted by the descriptions of FIGS. 4 to 6.

A housing 1401 of a filler unit 1400 may be provided in an inverted frusto-conical shape. Although not illustrated, the housing 1401 may be provided in a cylindrical shape. Although not illustrated, the housing 1401 may have a different flat surface depending on the shape of the substrate W.

The housing 1401 is formed of a metallic material. The metallic material preferably has a high thermal conductivity. Furthermore, the metallic material is a material that resists a supercritical fluid in a high-temperature and high-pressure state. The metallic material is preferably stainless steel. A measurement unit 1410 is preferably integrally embedded in the housing 1401. The housing 1401 includes a connector 1413 exposed to the outside.

The measurement unit 1410 includes a board 1111, a temperature sensor array including temperature sensors 1112, a module device 1413, and a battery 1120.

Figure 10:
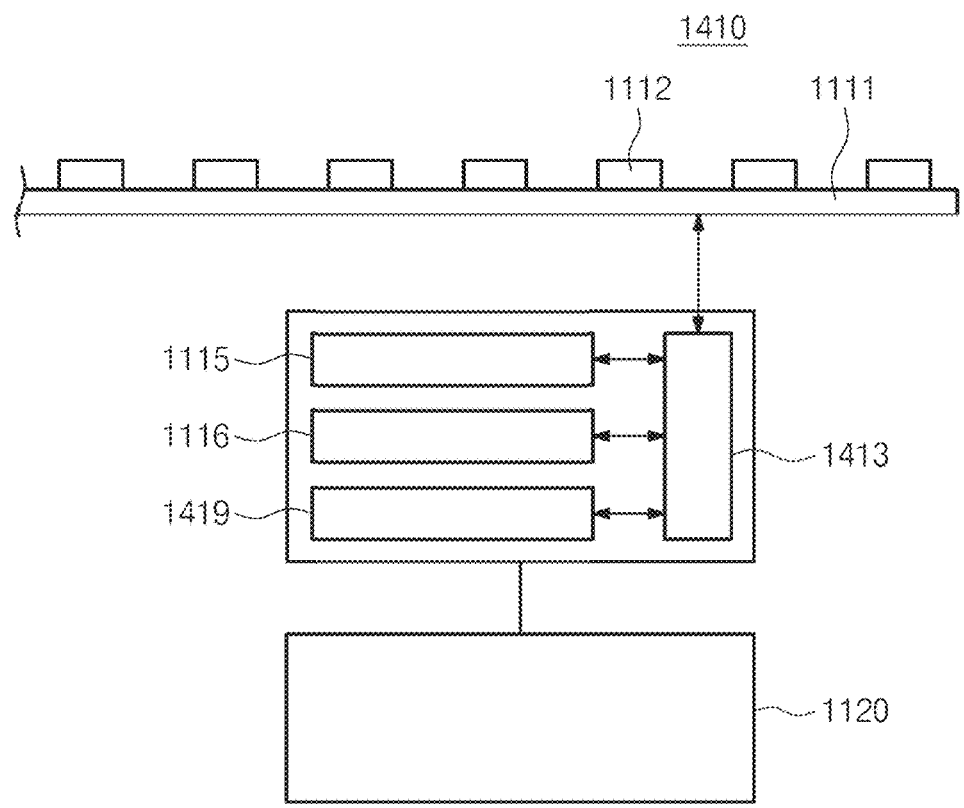
FIG. 10 is a schematic view illustrating a measurement unit 1410.

FIG. 10 is a schematic view illustrating the measurement unit 1410.

The measurement unit 1410 may include a memory 1419. The memory 1419 may be connected to the connector 1413. The connector 1413 may be connected with the memory 1419 and may transmit data in the memory 1419 to the outside.

A substrate treating apparatus according to an embodiment of the inventive concept may monitor a process by receiving a sensed value of a measurement unit in real time. Furthermore, through the process monitoring based on the sensed value of the measurement unit, feedback control may be performed on at least one of the temperature and the pressure in a process chamber.

Although not illustrated, a module device may include only one of sensors, a communication module, and a processor module. The sensors, the communication module, and the processor module are not provided in a module device form and may be provided as separate components. A battery may be included in the module device.

According to the embodiments of the inventive concept, the substrate treating apparatus and method may improve cleaning efficiency in cleaning a substrate using a supercritical fluid.

Furthermore, the substrate treating apparatus and method may monitor a state in a chamber when cleaning a substrate using a supercritical fluid.

In addition, the substrate treating apparatus and method may detect an optimal process condition when cleaning a substrate using a supercritical fluid.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a process chamber having a process space in which the substrate is treated with a fluid in a supercritical state;
    a support unit configured to support the substrate in the process space;
    a fluid supply unit configured to supply the fluid into the process space;
    a filler member configured to face the substrate placed on the support unit in the process space; and
    a measurement unit configured to measure a state in the process space,
    wherein the measurement unit is provided in the filler member, and
    wherein the filler member includes,
        a housing including a first material, and
        a transmissive window including a second material and installed in the housing, the transmissive window capable of transmitting a wireless communication signal therethrough, a heat transfer rate of the first material being higher than a heat transfer rate of the second material.

2. The apparatus of claim 1, wherein the measurement unit includes temperature sensors.

3. The apparatus of claim 2, wherein the measurement unit includes a board on which the temperature sensors are provided in an array.

4. The apparatus of claim 2, wherein the temperature sensors are provided in one or more arrays and are provided on a surface facing the substrate.

5. The apparatus of claim 1, wherein a hole is formed in the housing, and the transmissive window is provided in the hole.

6. The apparatus of claim 1, wherein the first material is a metallic material, and the second material is a resin material.

7. The apparatus of claim 1, wherein the second material is at least one of PEEK, polyamide, or PTFE.

8. The apparatus of claim 1, wherein
    the housing includes an upper member and a lower member,
    the transmissive window is between the upper member and the lower member to define an interior space such that the upper member and the lower member define a top and a bottom of the interior space, and the transmissive window defines a respective side of the interior space, and
    each of the upper member and the lower member includes a material having a higher heat transfer rate than the second material of the transmissive window.

9. The apparatus of claim 8, wherein each of the upper member and the lower member includes a metallic material.

10. The apparatus of claim 8, wherein the second material is a resin material.

11. The apparatus of claim 8, wherein the measurement unit includes:
    one or more sensors;
    a battery configured to supply power to the sensors; and
    a communication module configured to transmit signals measured by the sensors to an outside.

12. The apparatus of claim 11, wherein the communication module is adjacent to the transmissive window.

13. The apparatus of claim 1, wherein the process chamber includes:
    an upper body in which the support unit is installed;
    a lower body in which the filler member is installed, the lower body being configured to provide the process space together with the upper body;
    an actuator configured to move one of the upper body and the lower body relative to the other;
    an upper supply line configured to supply the fluid into the process space and provided in the upper body; and
    a lower supply line configured to supply the fluid into the process space and provided in the lower body,
    wherein the support unit is configured to support the substrate such that a patterned surface of the substrate faces upward, and
    wherein the filler member is between the lower supply line and the substrate.

14. The apparatus of claim 13, wherein
    the support unit is configured to support an edge region of a bottom surface of the substrate, and
    the filler member is below the support unit in the process space.

15. The apparatus of claim 13, wherein the measurement unit includes:
    one or more sensors; and
    a memory configured to store information values measured by the one or more sensors.

16. The apparatus of claim 15, wherein the measurement unit further includes a battery configured to supply power to the one or more sensors.

17. The apparatus of claim 15, further comprising:
a connector exposed outside the housing and connected with the memory, the connector being capable of transmission of data in the memory to an outside.

18. The apparatus of claim 1, wherein the measurement unit further includes one or more of a pressure sensor and a leveling sensor configured to measure posture of the apparatus.

19. An apparatus for treating a substrate, the apparatus comprising:
a process chamber having a process space in which the substrate is treated with a fluid in a supercritical state;
a support unit provided in the process space and configured to support an edge region of a bottom surface of the substrate;
a fluid supply unit configured to supply the fluid into the process space;
a filler member disposed to face the substrate placed on the support unit in the process space, the filler member being located below the support unit; and
a measurement unit provided in the filler member and configured to measure a state in the process space,
wherein the process chamber includes,
an upper body in which the support unit is installed,
a lower body in which the filler member is installed, the lower body being configured to provide the process space together with the upper body,
an actuator configured to move one of the upper body and the lower body relative to the other,
an upper supply line configured to supply the fluid into the process space and provided in the upper body, and
a lower supply line configured to supply the fluid into the process space and provided in the lower body,
wherein the filler member is located between the lower supply line and the substrate,
wherein the measurement unit includes,
a communication module, and
one or more of a temperature sensor, a pressure sensor, and a leveling sensor configured to measure posture of the apparatus,
wherein the filler member includes a housing including a first material and a transmissive window including a second material and installed in the housing, the transmissive window being capable of transfer of a wireless communication signal, and
wherein the first material has a higher heat transfer rate than the second material.

* * * * *